(12) United States Patent
Kobayashi et al.

(10) Patent No.: US 8,729,680 B2
(45) Date of Patent: May 20, 2014

(54) SEMICONDUCTOR DEVICE

(71) Applicant: Shinko Electric Industries Co., Ltd., Nagano (JP)

(72) Inventors: Narue Kobayashi, Nagano (JP);
Tomoharu Fujii, Nagano (JP);
Yukiharu Takeuchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/676,569

(22) Filed: Nov. 14, 2012

(65) Prior Publication Data

US 2013/0163206 A1 Jun. 27, 2013

Related U.S. Application Data

(62) Division of application No. 12/972,894, filed on Dec. 20, 2010, now Pat. No. 8,373,997.

(30) Foreign Application Priority Data

Dec. 25, 2009 (JP) ................................. 2009-294434

(51) Int. Cl.
*H01L 29/40* (2006.01)
*H01L 23/12* (2006.01)
*H01L 23/34* (2006.01)

(52) U.S. Cl.
USPC ............ 257/664; 257/728; 257/711; 257/713

(58) Field of Classification Search
USPC .................................. 257/664, 711, 713, 728
See application file for complete search history.

(56) References Cited

U.S. PATENT DOCUMENTS

| 5,814,883 | A | 9/1998 | Sawai et al. | 257/712 |
| 7,119,004 | B2 | 10/2006 | Ida | |
| 7,453,147 | B2 | 11/2008 | Ida | |
| 2004/0125579 | A1* | 7/2004 | Konishi et al. | 361/783 |

FOREIGN PATENT DOCUMENTS

| JP | 9-283544 | 10/1997 |
| JP | 2002-198660 | 7/2002 |
| JP | 2003-273297 | 9/2003 |
| JP | 2003-347460 | 12/2003 |

(Continued)

OTHER PUBLICATIONS

Notice of Reasons for Refusal mailed Aug. 20, 2013 from the Japanese Patent Office in counterpart application No. 2009-294434 with English translation.

*Primary Examiner* — Luan C Thai
(74) *Attorney, Agent, or Firm* — Kratz, Quintos & Hanson, LLP

(57) ABSTRACT

A semiconductor device includes a structure in which a semiconductor element (chip) is mounted in a cavity formed in a wiring board with an adhesive interposed between the chip and a bottom surface of the cavity, and electrode terminals of the chip are connected via wires to wiring portions formed on the board around the cavity. The chip is mounted in close contact with a side wall of the cavity, the side wall being near a region where a wiring for higher frequency compared with other wirings within the wiring portion is formed. A recessed portion is provided in a region of the bottom surface of the cavity, and a thermal via extending from the bottom surface of the recessed to the outside of the board is provided, the region being near a portion where the chip is in close contact.

4 Claims, 5 Drawing Sheets

(56) References Cited

FOREIGN PATENT DOCUMENTS

| JP | 2004-071772 | 3/2004 |
| JP | 2005-353938 | 12/2005 |
| WO | WO 03/023843 A1 | 3/2003 |
| WO | 2006/048932 | 5/2006 |

* cited by examiner

SEMICONDUCTOR DEVICE

CROSS-REFERENCE TO RELATED APPLICATION

This application is a Divisional Application of Ser. No. 12/972,894 filed on Dec. 20,2010, which is based upon and claims the benefit of priority of the prior Japanese Patent Application No. 2009-294434, filed on Dec. 25, 2009, the entire contents of which are incorporated herein by reference.

FIELD

The embodiments discussed herein are related to a semiconductor device in which a semiconductor element is mounted on a wiring board.

BACKGROUND

In a wiring board (also referred to as "package") with a built-in millimeter wave antenna for an IC including a circuit for millimeter wave band (wavelength: 1 mm to 10 mm and frequency: 30 GHz to 300 GHz), considerations should be made on several points in terms of the structure in order to secure required characteristics (high frequency transmission characteristics, antenna directivity and the like) when designing the structure of the package.

As one of the points, an IC (semiconductor chip) is mounted on a package by bonding using wires. Here, where the length (wire length) of each of the wires connecting electrode pads of the chip to the pads (each being a portion defined in the wiring) on the board is long, parasitic inductance increases and thus causes deterioration in the quality of signals. Thus, the chip needs to be arranged in such a way that the wire length can be made as short as possible. For this reason, a recessed portion (cavity) is formed in the package, and the chip is mounted in the cavity.

Here, the chip is mounted in such a way that the back surface (surface opposite to the surface where the electrode pads are formed) of the chip is adhered to the bottom surface of the cavity through an adhesive (electrically conductive paste or the like) applied to the bottom surface of the cavity. In addition, in order to make the wire length as short as possible, the cavity is formed to have a depth approximately equal to the thickness of the chip.

Furthermore, since the temperature of the IC (chip) including a millimeter wave circuit becomes high due to a high frequency operation of the chip, some measures to radiate the heat generated during the operation of the chip to the outside of the package need to be taken in order to prevent thermal runaway, destruction or the like of the chip. As a typical measure, a thermal via (via hole for heat radiation) is formed. This thermal via is formed to penetrate the board in the thickness direction thereof in a manner connecting the bottom surface (which is thermally bonded to the chip with an adhesive interposed therebetween) of the cavity provided in the package to the outside of the board.

As an example of the technique related to the conventional art, there is a semiconductor device described in Patent document 1 (International Publication Pamphlet No. WO 2003/023843). In this semiconductor device, a semiconductor chip is fixed onto a bottom surface of a quadrangular recess (cavity) provided in a wiring board, while one side of the chip is brought into contact with one side of the inner side wall of the cavity (FIG. 5). In addition, as another art, there is a semiconductor device described in Patent document 2 (Japanese Laid-open Patent Publication No. 9-283544). In this semiconductor device, a cavity is provided in a package, and grooves are formed on a surface of a cavity where the cavity and a semiconductor are to be in contact with each other. Moreover, as an example of the technique related to the heat radiation of a package, there is a technique described in Patent document 3 (Japanese Laid-open Patent Publication No. 2002-198660). In this technique, a circuit board is provided with multiple thermal via holes being arranged inside an insulating substrate and penetrating the substrate in the thickness direction thereof. Here, the thermal via holes are formed using a paste containing two types of Ag powders having different average grain sizes.

As described above, a package (wiring board) including a semiconductor element (chip) and transmission lines for high frequency waves such as millimeter wave bands is configured as follows for the purpose of securing required characteristics. A cavity is provided in a board and the chip is mounted in the cavity. In addition, the chip and a wiring portion formed on the board are electrically connected to each other by wire bonding. In other words, the chip is arranged in a manner that the wire length is made as short as possible. Thus, an increase in parasitic inductance is prevented.

Such a consideration in design can be expected to be somewhat effective for transmission of a high frequency (20 GHz, 2 GHz or the like) signal with a longer wavelength than a millimeter wave band (frequency: 30 GHz to 300 GHz), but is not so effective for transmission of a millimeter wave signal. Specifically, signal quality in millimeter wave signal transmission is deteriorated by factors including reflection caused by a difference in characteristic impedance between wiring paths, and minute parasitic inductance generated due to wiring, which has been ignorable heretofore. Accordingly, there is a need for taking measures such as making the length of a wire used in high frequency transmission paths, particularly ones used in millimeter wave transmission paths, as short as possible.

In addition, in the state of the art, a product using a frequency of 60 GHz or higher in the millimeter wave band has not yet been developed. Thus, a design taking various points such as a board configuration or a mounting method into consideration is needed.

Note that, in the configuration disclosed in Patent document 1 described above, the chip and the inner side wall are in close contact with each other in the cavity. For this reason, the heat released from the chip is likely to remain near this portion. Accordingly, the heat radiation properties near this portion are expected to be deteriorated as compared with the other region. Patent document 1, however, does not mention anything about a technique or a method for performing heat radiation at all.

SUMMARY

According to one aspect of the invention, there is provided a semiconductor device including a wiring board including a cavity formed therein and a wiring portion formed thereon around the cavity, a semiconductor element mounted on a bottom surface of the cavity via an adhesive, the semiconductor element having an electrode terminal connected via a wire to the wiring portion of the wiring board, and a heat-radiating structure, wherein the semiconductor element is mounted in close contact with a side wall of the cavity, the side wall being near a region where a wiring for higher frequency compared with other wirings within the wiring portion is formed, and the heat-radiating structure is provided in a region of the bottom surface of the cavity, the region being near a portion where the semiconductor element is in close contact with the side wall, the heat-radiating structure being formed to pierce the wiring board in a direction from the bottom surface of the cavity toward a side opposite to the cavity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings.

Figure 1:
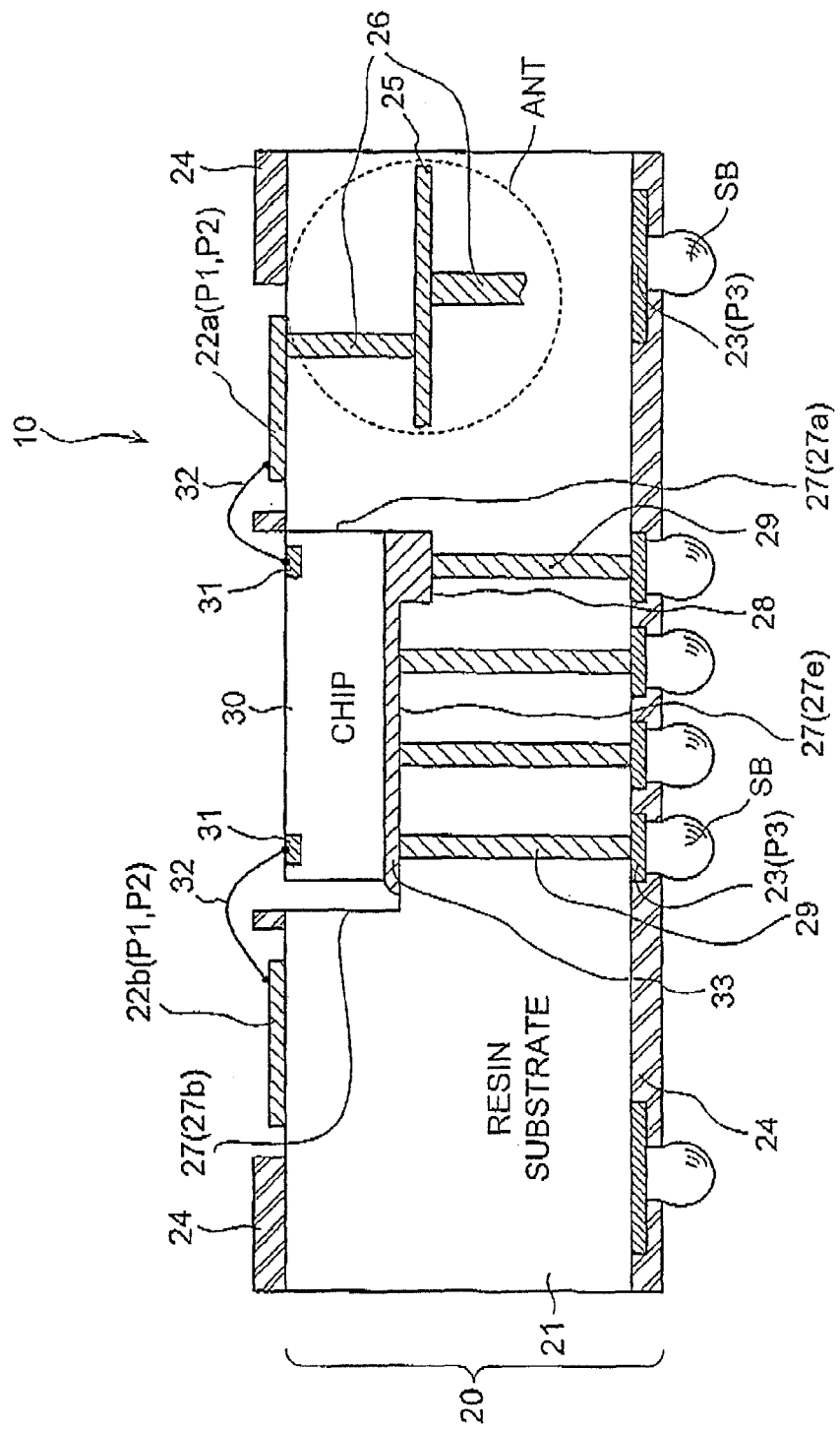
FIG. 1 is a cross-sectional view illustrating a configuration of a semiconductor device according to a first embodiment.
Figure 2:
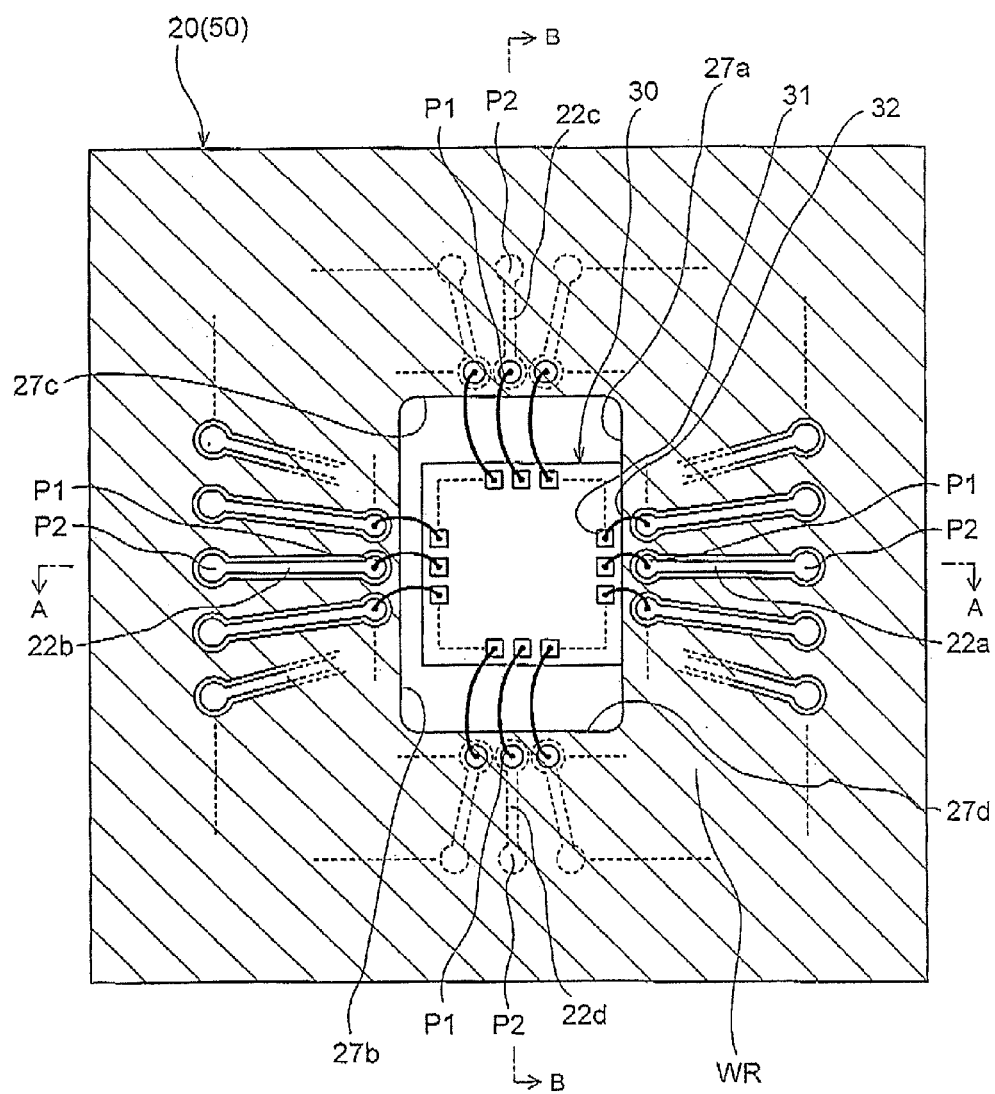
FIG. 2 is a schematic plan view illustrating the semiconductor device of FIG. 1 as viewed from a surface on which a chip is mounted.

(First Embodiment; see FIGS. 1 and 2)

FIG. 1 illustrates a configuration of a semiconductor device according to a first embodiment, in a cross-sectional view. FIG. 2 illustrates a schematic configuration of the semiconductor device (FIG. 1), in a plan view, as viewed from a surface on which a chip is mounted.

A semiconductor device 10 according to the embodiment is incorporated and used in a portable terminal device such as a FDA adapted to perform large amount of data communications such as image transmission, for example. The semiconductor device 10 has a wiring board (package) 20, and a semiconductor element (chip) 30 mounted on one of surfaces of the wiring board 20. Further, although not particularly illustrated in FIG. 1, a cap to seal the chip 30 and conductor portions (bonding wires 32, wiring layers 22a and the like) connected to the chip 30 is appropriately provided.

The wiring board (package) 20 has a resin substrate 21 forming the main body of the board. As the resin substrate 21, a substrate configured as follows is sufficient: at least outermost wiring layers 22 (22a, 22b, 22c and 22d) and 23 are formed respectively on both surfaces of the substrate, and the wiring layers 22 and 23 are electrically connected to each other through an inner portion of the substrate.

A wiring layer 25 may be formed inside the resin substrate 21 as illustrated, but it is not required. Here, consider a configuration where wiring layers are formed inside the resin substrate 21. Although detailed illustration of the configuration is omitted because such a configuration is not a portion characterizing the present invention, in this configuration, the outermost wiring layers 22 and 23 are electrically connected to each other through the wiring layers and via holes. The wiring layers are formed inside the substrate with a resin layer (insulating layer) interposed between the wiring layers (in the example of FIG. 1, only a single wiring layer, which is the wiring layer 25, is illustrated for simplicity of illustration). The via holes (conductor filled into the via holes: vias 26) mutually connects the wiring layers. A build-up process can be used to form the substrate of this configuration, for example. Meanwhile, in a configuration having no wiring layer formed inside the resin substrate, the outermost wiring layers are mutually connected to each other via through holes (conductor filled into the through holes) appropriately formed at required positions in the resin substrate.

Typically, copper (Cu) is used for the material of the wiring layers 22, 23 and 25 and the vias 26. In addition, a thermosetting epoxy-based resin, polyimide-based resin or the like is preferably used as a material of the resin layer (insulating layer).

Furthermore, a solder resist layer (not illustrated) serving as a protection film is formed on the one surface of the package 20 (surface on which the chip 30 is mounted) so as to cover the surface while exposing portions corresponding to pads P1 and P2 defined at required positions in the outermost wiring layer 22. However, as described later, among the wiring layers 22 (a, b, c and d), the wiring layers 22a and 22b have their wiring portions exposed together with the pads P1 and P2, and the wiring layers 22c and 22d have only their pads P1 exposed.

A solder resist layer 24 serving as a protection film is also formed on the other surface of the package 20 so as to cover the surface while exposing the portions corresponding to pads P3 defined at required positions in the outermost wiring layer 23. An appropriate surface treatment is applied to the pads P3 exposed from the solder resist layer 24 to improve contact properties. This is because external connection terminals (solder balls SB in the illustrated example) for use in mounting the semiconductor device 10 on a motherboard or the like are bonded respectively to the pads P3. Typically, nickel (Ni) plating and gold (Au) plating are applied on the pads P3 (Cu) in the order named. In this case, the Ni plating layer functions as a barrier metal film.

Note that, the solder balls SB (external connection terminals) are provided respectively to the pads P3 in the example illustrated in FIG. 1, but are not necessarily required. Basically, it is sufficient as long as the pads P3 are exposed so as to allow the external connection terminals (solder balls, metal pins or the like) to be bonded thereto when necessary.

The wiring board (package) 20 has a square shape when viewed in a plan view as illustrated in FIG. 2. The size of the wiring board 20 is selected to be approximately 15 mm×15 mm and the thickness to be 1 mm. Further, a cavity 27 for mounting and housing a semiconductor element (chip) 30 in the board is formed in the one surface the package 20 at an approximately center portion.

The cavity 27 is formed in a rectangular shape (rectangle) as illustrated in FIG. 2, and the four corners of the rectangle are rounded. The size of the cavity 27 is selected to be approximately 6 mm in length in the long side direction, approximately 4 mm in length in the short side direction, and approximately 300 μm in depth. Note that, although the cavity 27 is formed in a rectangular shape (rectangle) in the illustrated example, the shape of the cavity 27 is not necessarily limited to this in particular and may be a square or another shape as a matter of course.

The chip 30 to be mounted in the cavity 27 is a silicon chip (also called a "die") obtained by dicing multiple devices on a silicon wafer into each unit, the multiple devices fabricated on the silicon wafer by application of a required device process, for example. The chip 30 is mounted in the cavity 27 in a face-up manner in which the surface with electrode pads (terminals) 31 formed thereon are faced up. Here, an adhesive 33 is interposed between the chip 30 and a bottom surface 27a of the cavity 27. For example, an electrically conductive paste (paste obtained by dispersing metal fine particles of Ag, Cu or the like into a thermosetting resin such as an epoxy-based resin) is applied to the bottom surface of the cavity 27, and the chip 30 is placed on this electrically conductive paste (adhesive 33). Then, the adhesive 33 is cured by heating, and thus the chip 30 adheres and is fixed to the package 20 (inside of the cavity 27) (die attach).

The region around the cavity 27 on the wiring board (package) 20 is referred to as a wiring formation region WR (FIG. 2). In the wiring formation region WR, transmission lines (wiring layers 22a and 22b) for high frequency waves such as millimeter wave bands are provided in regions (two regions respectively on the right and left sides of the cavity 27 in the example illustrated in FIG. 2) each on the outer side of a circumferential portion (side wall 27a or 27b) extending along the long side of the cavity 27. In this embodiment, the wiring layers 22a for 60 GHz (millimeter wave band) are formed in the right wiring formation region, while the wiring layers 22b for a high frequency wave with a wavelength longer than the millimeter wave band (20 GHz, 2 GHz or the like) are formed in the left wiring formation region, which is opposite to the right wiring formation region.

Meanwhile, wiring layers for input and output (I/O) signal transmission for the chip 30, and the wiring layers 22c and 22d for power supply and ground are formed in regions (two regions respectively on the upper and lower sides of the cavity 27 in the example illustrated in FIG. 2) each on the outer side of a circumferential portion (side wall 27c or 27d) extending along the short side of the cavity 27.

The reason for forming the wiring layers 22a and 22b for high frequency waves in the two regions of the wiring formation region WR on the right and left sides of the cavity CV is that the distance between each bonding pad P1 of the wiring, and the corresponding electrode pad 31 of the chip 30 (length of each wire 32 serving as a part of the high frequency transmission line) can be reduced. Specifically, the wire length is made short to reduce parasitic inductance generated in the wire portion. Thus, quality deterioration in the signals of high frequency wave such as millimeter wave bands which is transmitted on the wiring can be suppressed.

In this embodiment, as illustrated, the chip 30 is mounted in the cavity 27 in such a way that a corresponding side surface of the chip 30 is brought into close contact with the side wall 27a being near the region where the wiring layers 22a for millimeter wave band are formed. Accordingly, the length of each of the wires 32 connecting the pads P1 of the wiring layers 22a for millimeter wave band to the corresponding electrode pads 31 of the chip 30 can be further reduced. Thus, further suppression of quality deterioration of millimeter wave band signals can be achieved.

In this case, the length become relatively long for each of the wires 32 which are provided for the wiring layers 22b for high frequency and which connect the bonding pads P1 to the corresponding electrode pads 31 of the chip 30, the wiring layers 22b positioned in the region opposite to a portion where the chip 30 is in close contact with the side wall in the cavity 27. However, the length of each of the wires for the wiring layers 22b is sufficiently short as compared with the length of each of the wires connecting the pads P1 of the other wiring layers 22c and 22d to the corresponding electrodes pads 31 of the chip 30. Accordingly, the length of each wire for the wiring layer 22b is short enough to reduce the parasitic induction and thereby to suppress quality deterioration of high frequency signals.

Moreover, an antenna ANT (see FIG. 1) formed inside the resin substrate 21 is connected to the wiring layers 22a for millimeter wave band, which is formed on the front surface of the package 20, via the interlayer connection pads P2 of the wiring layers 22a. In this embodiment, the antenna ANT is formed of a part of the wiring layer 25 inside the substrate and the vias 26 connected thereto as illustrated. The form of the antenna ANT is not limited to the illustrated example as a matter of course.

The wiring layers 22c and 22d for I/O signal transmission, power supply, and ground are coated by the solder resist layer 24 with only the bonding pads P1 thereof exposed. Illustration of the solder resist layer is omitted in the example illustrated in FIG. 2.

Meanwhile, in order to secure required characteristics, in the wiring layers 22a and 22b for high frequency waves such as millimeter wave bands, the wiring portions thereof are not covered by the solder resist layer and are thus exposed on the surface of the package 20 similarly to the boding pads P1 and the interlayer connection pads P2 (see FIG. 1). Accordingly, in order to protect these exposed portions from outside (i.e., to eliminate influence on the transmission characteristics of the high frequency waves such as millimeter waves), a concave cap (not illustrated) having a hollow structure is needed for sealing.

Such a cap is adhered onto the package 20 by a thermosetting resin (adhesive) such as an epoxy-based resin having heat resistance. The heat resistance of the adhesive in this case can withstand a reflow temperature (around 240 to 260° C., for example) when external connection terminals (e.g., solder balls SB in the illustrated example) are eventually bonded to the mounting surface of the package 20.

The cavity 27 provided on the package 20 can be formed on a multi-layered wiring resin substrate (required package 20) by cut processing such as router processing, the multi-layered wiring resin substrate formed by a build-up process or the like, for example. Moreover, a groove (recessed portion) 28 which is a portion characterizing the present invention is formed at a portion of the bottom surface 27e of the cavity 27. The groove 28 can be formed by use of router processing or the like as in the case of the cavity 27.

The groove 28 is provided on an edge portion of the bottom surface 27e of the cavity 27 as illustrated. More specifically, the groove 28 is formed linearly along the edge portion where the bottom surface 27e of the cavity 27 and the side wall 27a meet each other. Here, the side wall 27a is in contact (close contact) with the side surface of the chip 30 in the cavity 27. However, the groove 28 does not have to be necessarily continuous, and may be thus formed intermittently as appropriate in accordance with the amount of flow of the melted adhesive 33 (electrically conductive paste or the like) when the chip 30 is mounted.

The groove 28 (recessed portion) serves as an "adhesive accumulating portion" for accumulating a portion (extra portion of the adhesive 33 overflowing from the mounting portion) of the melted adhesive 33, when the chip 30 is mounted in a way that the corresponding side surface of the chip 30 is brought into contact with the side wall 27a in the cavity 27 near the region where the wiring layers 22a for millimeter wave band are formed. In particular, the groove 28 is preferably configured to actively accumulate (filled with) the adhesive 33 therein. With the function as the "adhesive accumulating portion," the groove 28 fulfills the following two roles.

The first role is to thermally bond the back surface (surface opposite to the face surface) of the chip 30 to some of later-described thermal vias 29 (thermal vias formed immediately below the groove 28) through the adhesive 33 (cured electrically conductive paste or the like) filling the groove 28. In particular, in a state where the groove 28 is filled with the adhesive 33 as illustrated, the transmission effect (thermal conductivity) of the heat released from the chip 30 to some of the thermal vias 29 can be enhanced as compared with the state where the groove 28 accumulates the adhesive 33 but is not filled with the adhesive 33 (i.e., state where air exits therebetween).

The second role is to prevent the melted adhesive 33 (electrically conductive paste or the like before being cured) from rising along the side wall 27*a* of the cavity 27 brought into close contact with the chip 30, when the chip 30 is mounted in the cavity 27. This is because, in a case where the adhesive 33 (electrically conductive paste or the like) crawls up to the top edge of the cavity 27, the adhesive 33 may be attached to the wiring layers 22*a* (pads P1) for millimeter wave band positioned near the top edge of the cavity 27 and then cause a short circuit. In addition, even in a case where the adhesive 33 is made of a thermosetting insulating resin such as an acrylic-based resin or epoxy-based resin instead of an electrically conductive paste, the high frequency transmission characteristics of the wiring layers 22*a* for millimeter wave band are affected when the adhesive 33 is attached thereto. This is because such an insulating resin also has a reasonable dielectric constant.

Furthermore, a required number of thermal vias 29 penetrating the board in the thickness direction thereof (heat radiation via holes in each of which Cu plating is applied at least to its inner wall portion) are formed with a constant arrangement pitch in a region immediately below the bottom surface 27*e* (including the groove 28) of the cavity 27 in the wiring board 20 (resin substrate 21). Among the thermal vias 29, some of the thermal vias 29 are exposed from the bottom surface of the groove 28 while the other thermal vias 29 are exposed from the bottom surface 27*e* (except for the region where the groove 28 is formed of the cavity 27). Each of the thermal vias 29 is thermally bonded to the back surface (surface opposite to the face surface) of the chip 30 with the adhesive 33 (cured electrically conductive paste or the like) interposed therebetween, the adhesive 33 coating the bottom surface 27*e* of the cavity 27 and the bottom surface of the groove 28.

Accordingly, the heat released during the operation of the chip 30 is surely transmitted to the thermal vias 29 through the adhesive 33 and then radiated to the outside of the package through the external connection terminals (solder balls SB) thermally connected to the respective thermal vias 29. In this case, there are two heat transmission paths to the thermal vias 29. One of the paths is a path (first heat-radiating structure) through which the heat is transmitted to some of the thermal vias 29 through the adhesive 33 filling the groove 28. The other one is a path (second heat-radiating structure) through which the heat is transmitted to the other thermal vias 29 through the adhesive 33 interposed between the back surface of the chip 30 and the bottom surface 27*e* (except for the region where the groove 28 is formed) of the cavity 27.

In particular, since the side surface of the chip 30 and the side wall 27*a* of the cavity 27 are in close contact with each other in the cavity 27, the heat is likely to be accumulated near the edge portion (edge portion where the side wall 27*a* and the bottom surface 27*e* meet each other) of the cavity 27 and the heat radiation properties become poor as compared with the other portion unless some measure is taken. In this embodiment, however, the groove 28 (recessed portion) is provided near the edge portion. Thus, the heat accumulated near the edge portion of the cavity 27 can be effectively released to the outside of the package 20 through the first heat-radiating structure (adhesive 33 filling the groove 28, and the thermal vias 29 thermally connected thereto) (improvement in heat radiation properties).

As described above, the semiconductor device 10 according to the first embodiment has the following configuration. The chip 30 is mounted in the cavity 27 provided in the package 20 with a side surface of the chip 30 being in close contact with the side wall 27*a* being near the region where wiring layers 22*a* for millimeter wave band are formed. In addition, the groove 28 (recessed portion) is provided in the region of the bottom surface 27*e* of the cavity 27, the region being near the side wall 27*a* in close contact with the chip 30. Moreover, formed are the thermal vias 29 (aforementioned first and second heat-radiating structures) exposing from the bottom surface of the groove 28 and the bottom surface 27*e* (except for the region where the groove 28 is formed) of the cavity 27.

First of all, the chip 30 is brought into close contact with the side wall 27*a* when the chip 30 is mounted in the cavity 27, the side wall 27*a* being near the region where the wiring layers 22*a* for millimeter wave band are formed. Thus, the length of each of the bonding wires 32 connecting the electrode pads 31 of the chip 30 to the pads P1 of the wiring layers 22*a* can be short (as short as possible). Accordingly, the parasitic inductance generated at the wiring portions can be minimized. As a result, the quality deterioration of millimeter wave band signals due to the influence of the parasitic inductance can be suppressed.

Moreover, the chip 30 is mounted with the adhesive 33 (electrically conductive paste or the like) interposed between the bottom surface 27*e* and the chip 30 in a state where the chip 30 is in close contact with the side wall 27*a* in the cavity 27. Here, a portion (extra portion of the adhesive 33 overflowing from the mounting portion) of the melted adhesive 33 is accumulated in the groove 28 when the chip 30 is mounted, and the groove 28 is thus filled with the portion of the adhesive 33. Accordingly, the back surface of the chip 30 can be surely thermally bonded to the corresponding thermal vias 29 through the adhesive 33 interposed between the back surface of the chip 30 and the bottom surface 27*e*, and through the adhesive 33 filling the groove 28.

In particular, the heat is likely to be accumulated around the region of the bottom surface 27*e*, the region being near the portion where the chip 30 is in close contact with the side wall in the cavity 27. Thus, the groove 28 (the adhesive resin 33 filling the groove 28) provided at this region is actively used as the heat radiation means (first heat-radiating structure). This is very effective in improving the heat radiation properties.

Here, since the chip 30 is brought into close contact with the side wall 27*a* in the cavity 27, the portion of the melted adhesive 33 may crawl up along the side wall 27*a* when the chip is mounted. However, "rising" of the adhesive 33 can be prevented because the extra portion of the adhesive 33 overflowing from the mounting portion is accumulated in the groove 28 as described above. Accordingly, the inconvenience (short circuit or influence on the characteristics due to attachment of the adhesive 33 to the wiring layers 22*a* for millimeter wave band) that may occur when the adhesive 33 crawls up to the top edge of the cavity 27 can be resolved.

In the configuration (FIG. 1) according to the aforementioned first embodiment, described is an example of the case where the recessed portion (groove 28) is only formed in the region immediately below the cavity 27 along the edge portion where the side wall 27*a* and the bottom surface 27*e* of the cavity 27 meet each other, the side wall 27*a* being in close contact with the side surface of the chip 30 in the cavity 27.

Figure 3A:
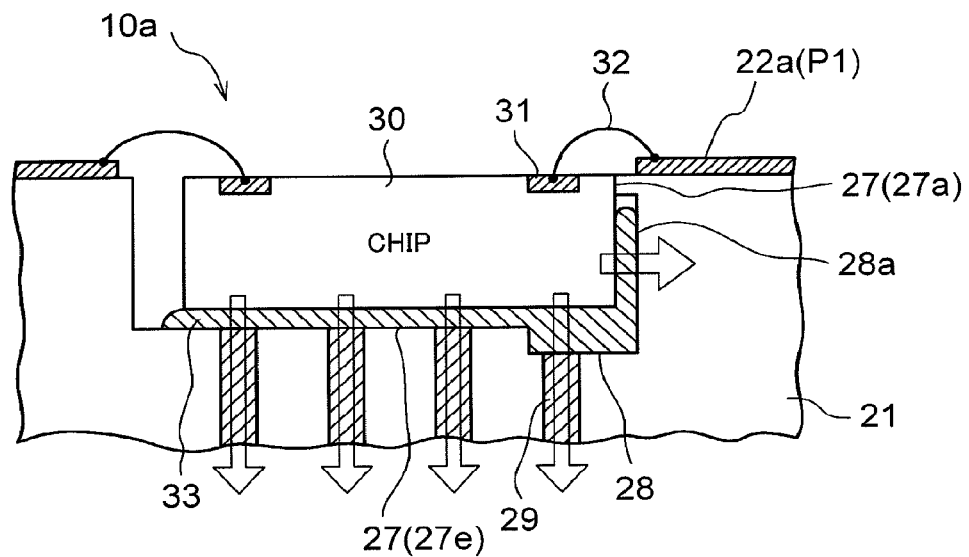
FIGS. 3A and 3B are cross-sectional views each illustrating a configuration of a semiconductor device (principal portion) according to a modification of the first embodiment.
Figure 3B:
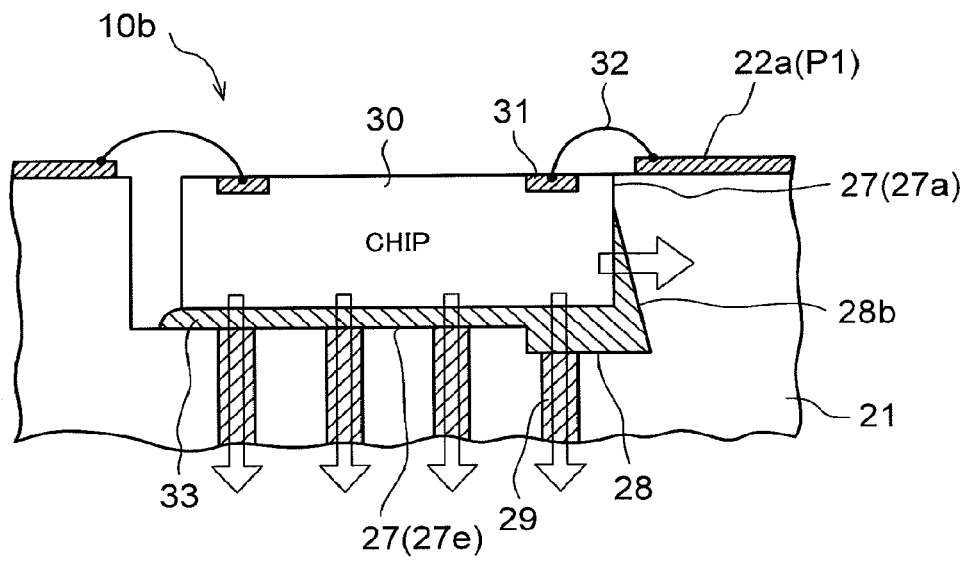

However, the shape and the arrangement of the recessed portion are not limited to those mentioned above as a matter of course. Basically, it is sufficient if the recessed portion is formed in a shape which is capable of accumulating the adhesive 33 (electrically conductive paste or the like) overflowing from the mounting portion when the chip 30 is mounted in the cavity 27 and thereby thermally bonding the chip 30 to the outside of the package through the portion where the adhesive is accumulated (adhesive 33) (first heat-radiating structure). FIGS. 3A and 3B illustrate modifications of this case.

FIGS. 3A and 3B each illustrate a cross-sectional view of a configuration of a principal portion (cavity 27 in which the chip 30 is mounted, and the region around the cavity 27) of a semiconductor device according to the modification of the first embodiment illustrated in FIG. 1. FIGS. 3A and 3B each illustrate an embodiment of a case where a heat radiation path different from the thermal vias 29, which are considered to be the original thermal path, is newly provided.

FIG. 3A illustrates a configuration (principal portion) of a semiconductor device 10a according to one modification. In the configuration of the semiconductor device 10a, a recessed portion 28a integrally connected to the groove 28 is formed on the side wall 27a in close contact with the side surface of the chip 30 in the cavity 27. Here, the adhesive 33 (electrically conductive paste or the like) is accumulated in the recessed portion 28a and thus used as heat-radiation means (first heat-radiating structure). Thus, the size (area) of the heat radiation path is increased. Specifically, the recessed portion 28a functions as the "adhesive accumulating portion" as similar to the groove 28.

The recessed portion 28a can be formed integrally with the groove 28 by router processing or the like. The recessed portion 28a is preferably formed in such a way that the top edge of the recessed portion 28a is at a position lower than the top edge of a substrate 21. When the top edge of the recessed portion 28a is positioned inside the substrate 21, the melted adhesive 33 can be surely prevented from rising along the side wall 27a to the top edge of the cavity 27 (adhesive 33 may be attached to the wiring layers 22a (pads P1) for millimeter wave band in this case) when the chip 30 is mounted in the cavity 27.

According to the configuration of the semiconductor device 10a, the heat released during the operation of the chip 30 can be radiated into the substrate 21, as illustrated by the arrow in the drawing, through the adhesive 33 accumulated in the recessed portion 28a on the side surface of the chip 30, in addition to the original heat radiation path (path through which the heat is transmitted to the thermal vias 29 through the adhesive 33 interposed between the back surface of the chip 30 and the bottom surface 27e of the cavity 27 as well as between the back surface of the chip 30 and the bottom surface of the groove 28, and eventually radiated to the outside of the package). Thus, the heat radiation effect can be further improved as compared with the semiconductor device 10 according to the first embodiment.

In particular, since the chip 30 and the side wall 27a of the cavity 27 are in close contact with each other in the cavity 27, the heat is likely to be accumulated near the edge portion of the cavity 27. Thus, the heat radiation properties of the edge portion are deteriorated as compared with the other portions in the cavity 27. In this modification, the recessed portion 28a provided additionally near the edge portion is used as the heat-radiation means (first heat-radiating structure). This is very effective in improving the heat radiation properties.

FIG. 3B illustrates a configuration (principal portion) of a semiconductor device 10b according to another modification. In the configuration of the semiconductor device 10b, as in the case of the semiconductor device 10a of FIG. 3A, a tapered recessed portion 28b integrally connected to the groove 28 is formed on the side wall 27a in close contact with the side surface of the chip 30 in the cavity 27. Here, the adhesive 33 (electrically conductive paste or the like) accumulated in the tapered recessed portion 28b is used as heat radiation means (first heat-radiating structure).

The tapered recessed portion 28b is formed in such a way that the horizontal depth of the recessed portion 28b becomes gradually shallower from the lower portion of the cavity 27 towards the upper portion thereof as illustrated. This recessed portion 28b can be also formed by router processing or the like as in the case of the aforementioned recessed portion 28a, and the recessed portion 28b is preferably formed in such a way that the top edge of the recessed portion 28b is at a position lower than the top edge of the substrate 21.

According to the configuration of the semiconductor device 10b, as in the case of the semiconductor device 10a of FIG. 3A, the heat released during the operation of the chip 30 can be radiated into the substrate 21 through the adhesive 33 accumulated in the recessed portion 28b on the side surface of the chip 30, in addition to the original heat radiation path (path through which the heat is radiated to the outside of the package through the thermal vias 29). Thus, such a configuration can make a contribution to a further improvement in the heat radiation properties.

Figure 4:
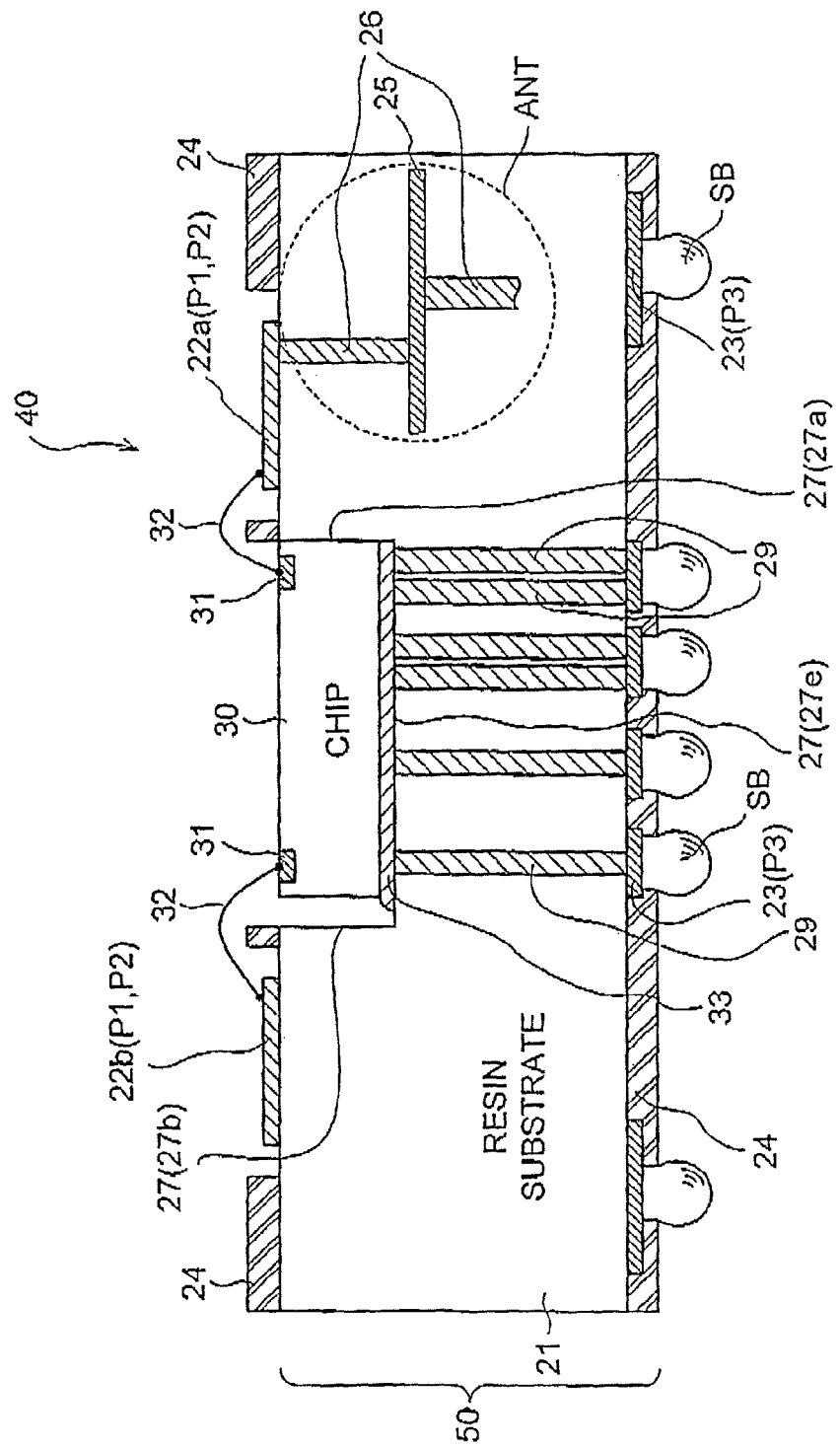
FIG. 4 is a cross-sectional view illustrating a configuration of a semiconductor device according to a second embodiment as taken along with a line in accordance with A-A line of FIG. 2.
Figure 5:
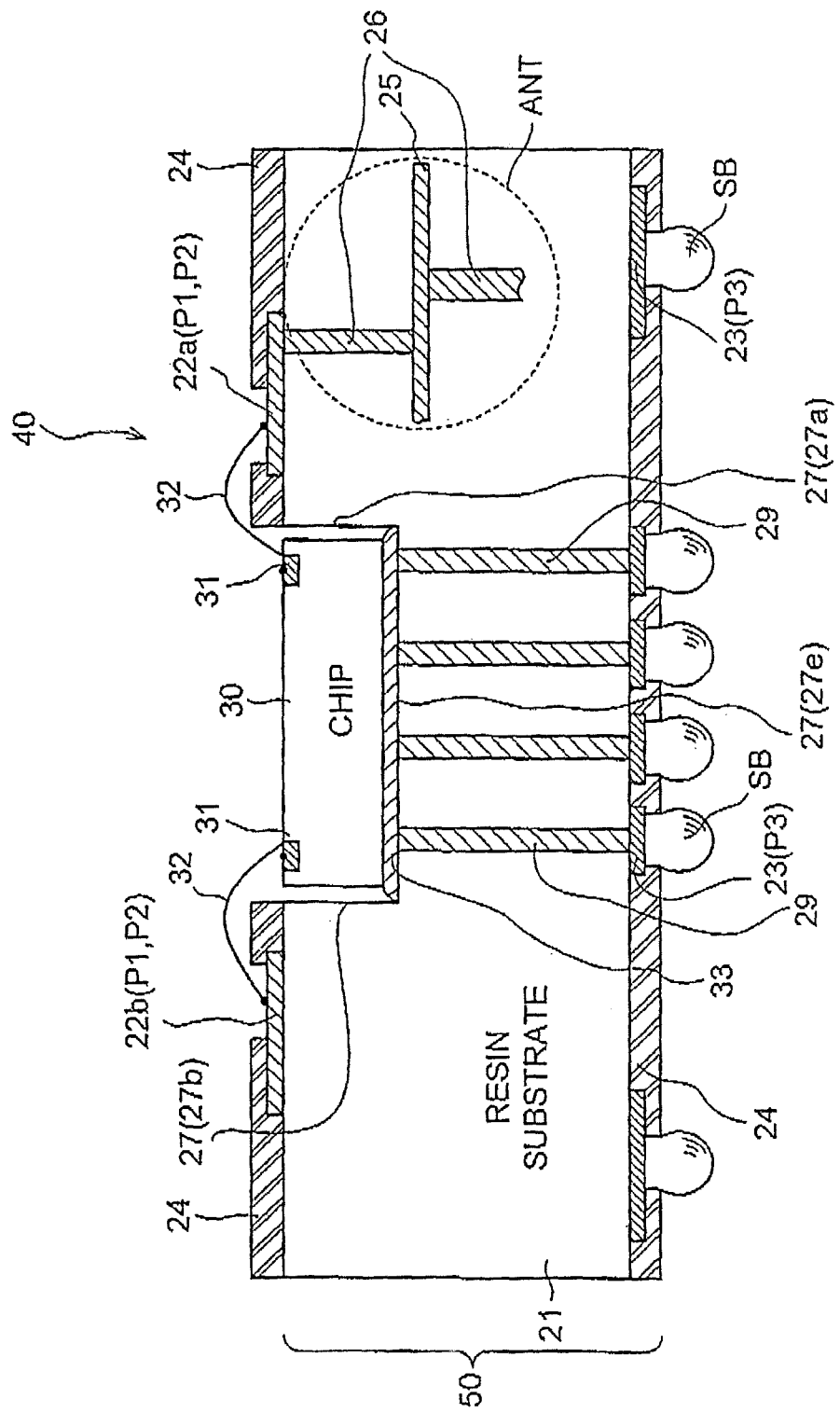
FIG. 5 is a cross-sectional view illustrating a configuration of the semiconductor device of FIG. 4 as taken along with a line in accordance with B-B line of FIG. 2.

(Second Embodiment; see FIG. 4)

FIG. 4 illustrates a configuration of a semiconductor device according to a second embodiment, in a cross-sectional view.

As compared with the configuration of the semiconductor device 10 (FIG. 1) according to the aforementioned first embodiment, the semiconductor device 40 according to the second embodiment (FIG. 4) is different in that: no groove 28 (FIG. 1) is provided at the bottom surface 27e of the cavity 27; and the thermal vias 29 formed in the region immediately below the cavity 27 provided in a wiring board (package) 50 are formed "densely" in a region of the bottom surface 27e of the cavity 27 instead of being formed with a constant pitch as in the case of the first embodiment, the region being near the portion where the chip 30 is in close contact with the side wall in the cavity 27 (region close to the region where the wiring layers 22a for millimeter wave band are formed).

Specifically, the number of thermal vias 29 formed per unit area in this region is set to be larger than that in the other region. The thermal vias 29 formed "densely" in the bottom surface 27e of the cavity 27 form the "first heat-radiating structure", while the thermal vias 29 formed in the other regions form the "second heat-radiating structure". The other configuration is the same as in the case of the first embodiment, and thus description thereof is omitted herein.

In the aforementioned first embodiment, the first heat-radiating structure is configured of the groove 28 (adhesive 33 used to fill in the groove 28) provided in a region of the cavity bottom surface 27e near the portion where the chip 30 is in close contact with the side wall in the cavity 27, and of the thermal vias 29 extending to the outside of the substrate from the bottom surface of the groove 28. In the configuration of the semiconductor device 40 according to the second embodiment, a required first heat-radiating structure is configured by "densely" forming the thermal vias 29 in the region of the cavity bottom surface 27e near the portion where the chip 30 is in close contact with the side wall in the cavity 27.

Accordingly, as in the case of the aforementioned first embodiment, the heat radiation properties can be effectively enhanced by the first heat-radiating structure (densely arranged thermal vias 29) provided in the portion in the cavity 27 where the heat is easily accumulated (portion near the region of the cavity bottom surface 27e near the portion where the chip 30 is in close contact with the side wall) in the configuration of the semiconductor device 40 according to the second embodiment.

In the configuration according to the second embodiment (FIG. 4), the thermal vias 29 are "densely" formed while being directly and thermally connected to the region of the cavity bottom surface 27e near the portion where the chip 30 is in close contact with the side wall in the cavity 27 (near the region where the wiring layers 22a for millimeter wave band are formed) (first heat-radiating structure). However, the thermal vias 29 (first heat-radiating structure) to be formed do not have to be necessarily directly and thermally connected to the bottom surface 27e of the cavity 27. For example, a recessed portion (groove 28) as described in the first embodiment (FIG. 1) may be interposed therebetween.

Specifically, the groove 28 is formed in the region of the cavity bottom surface 27e near the portion where the chip 30 is in close contact with the side wall in the cavity 27 (near the region where the wiring layers 22a for millimeter wave band are formed), and then, the thermal vias 29 may be formed "densely" in the bottom surface of the groove 28. In this case, the first heat-radiating structure is configured of the adhesive 33 filling the groove 28, and the thermal vias 29 arranged "densely" and extending from the bottom surface of the groove 28 to the outside of the substrate. According to this configuration, the number of thermal vias 29 as the heat radiation paths thermally bonded to the bottom surface of the groove 28 is relatively large as compared with the case of the first embodiment. Thus, a further improvement in the heat radiation properties can be achieved.

In addition, the configuration (FIG. 4) according to the second embodiment can be applied to the configuration of each of the semiconductor devices 10a and 10b according to the aforementioned modifications of the first embodiment. In this case, since the recessed portion 28a or 28b is integrally formed with groove 28, the bottom surface of the groove 28 is larger. Thus, the thermal vias 29 (portion of the first heat-radiating structure) can be "densely" formed, and the heat radiation properties can be further enhanced.

In the aforementioned embodiments, described is an example of a case where the thermal vias 29 are formed only in the region immediately below the semiconductor element (chip 30) in the cavity 27, but the region where the thermal vias 29 are formed is not limited to this as a matter of course. For example, instead of only in the region immediately below the chip 30, the thermal vias 29 may be formed in the enter surface of the groove 28 formed so as to be exposed from the mounting region of the chip 30 in the cavity 27. In this case, the heat can be radiated through the adhesive (adhesive 33 filling the groove 28) from thermal vias which are formed in the region other than the region immediately below the chip 30 and which are not thermally connected to the chip 30 in the cavity 27, the adhesive formed on the thermal vias. Such a configuration makes a contribution to a further improvement in the heat radiation properties.

Moreover, in the aforementioned embodiments, described is an example of a case where the chip 30 is brought into close contact with a predetermined one side wall (side wall 27a being near the region where wiring layers 22a for millimeter wave band are formed) when the chip 30 is mounted in the cavity 27. However, as apparent from the gist of the present invention, the chip 30 does not have to be necessarily brought into close contact with the only one side wall. For example, the chip 30 may be arranged in such a way that two sides of the chip 30 are respectively brought into contact (close contact) with two sides at most (two sides adjacent to each other) of the side wall in the cavity 27. In this case, the same configuration as in the first and second embodiments can be applied to this configuration, as for the arrangement of the groove 28, the recessed portion 28a or 28b and the thermal vias 29 to be formed. In this embodiment (configuration in which the chip 30 is brought into close contact with the two sides at most in the cavity 27), the same effects as those described above can be obtained in a case where the wiring layers 22c or 22d or the wiring layers 22b for a second high frequency wave are formed near the sides adjacent to the sides where the chip 30 and the side wall of the cavity are in contact with each other.

Moreover, in the aforementioned embodiments, described is an example of a case where the resin substrate is used as the form of the wiring board (package), but as apparent from the gist of the present invention, the form of the wiring board is not limited to a resin substrate as a matter of course. Thus, the present invention can be applied in the same manner to a case where a ceramic substrate is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
    a wiring board including a first surface and a second surface opposite to the first surface;
    a cavity formed in the first surface;
    a semiconductor element mounted on a bottom surface of the cavity via an adhesive and being in close contact with a side wall of the cavity, which is near the wiring for higher frequency; and
    a wiring layer for a high frequency wave and another wiring layer in each of which first and second pads are defined at both ends and which are formed on the first surface around the cavity, each of the wiring layer and the another wiring layer being electrically connected to the semiconductor element through the first pad;
    a first protection film and a second protection film formed on the first and second surfaces of the wiring board, respectively;
    a heat-radiating structure which is provided in the bottom surface of the cavity, and which includes a plurality of thermal vias formed through the wiring board in a direction from the bottom surface of the cavity toward the second surface,
    wherein in a part of the heat-radiating structure, which is near the portion where the semiconductor element is in close contact with the side wall of the cavity, the number of the thermal vias formed per unit area is larger than in the other part of the heat-radiating structure, and
    the first protection film from which the wiring layer for the higher frequency wave, the first and second pads of the wiring layer for the higher frequency wave are exposed and with which the another wiring layer and the second pad of the another wiring layer are covered other than the first pad of the another wiring layer.

2. The semiconductor device according to claim 1, wherein the part of the heat-radiating structure constitutes a first heat-radiating structure being a path through which the heat is transmitted to at least one of the thermal vias through the adhesive, and the other part of the heat-radiating structure constitutes a second heat-radiating structure being a path through which the heat is transmitted to at least the other one of the thermal vias through the adhesive on the bottom surface of the cavity.

3. The semiconductor device according to claim 1, wherein the wiring board includes an antenna electrically connected to the wiring for higher frequency.

4. The semiconductor device according to claim 1, wherein a length of the wiring for higher frequency compared with the other wirings within the wiring portion is shorter than that of the other wirings.

* * * * *